United States Patent [19]
Fukui et al.

[11] 3,978,375
[45] Aug. 31, 1976

[54] WIRING UNIT

[75] Inventors: Noriaki Fukui, Hirataka; Toyokiti Yamasita, Ibaragi, both of Japan

[73] Assignee: Matsushita Electric Industrial Co., Ltd., Osaka, Japan

[22] Filed: Apr. 15, 1974

[21] Appl. No.: 460,886

[30] Foreign Application Priority Data

| | | |
|---|---|---|
| July 17, 1973 | Japan | 48-81747 |
| July 17, 1973 | Japan | 48-81748 |
| Apr. 20, 1973 | Japan | 48-47945[U] |
| July 17, 1973 | Japan | 48-85378[U] |
| July 17, 1973 | Japan | 48-85379[U] |
| July 17, 1973 | Japan | 48-85380[U] |
| July 17, 1973 | Japan | 48-85381[U] |
| July 17, 1973 | Japan | 48-85382[U] |
| July 17, 1973 | Japan | 48-85383[U] |
| July 17, 1973 | Japan | 48-85384[U] |

[52] U.S. Cl. ............................. 317/101 C; 357/70; 174/52 PE
[51] Int. Cl.² ......................................... H05K 1/04
[58] Field of Search .............. 317/101 CC, 101 CM, 317/101 C; 174/52 S, 52 PE; 357/70

[56] References Cited
UNITED STATES PATENTS

| | | | |
|---|---|---|---|
| 1,718,993 | 7/1929 | Wermine | 317/101 CC |
| 2,478,469 | 8/1949 | Earle | 317/101 C |
| 2,613,252 | 10/1952 | Heibel | 317/101 CC |
| 3,164,749 | 1/1965 | Berge et al. | 317/101 CE |
| 3,216,089 | 11/1965 | Dettman | 317/101 CW |

*Primary Examiner*—David Smith, Jr.
*Attorney, Agent, or Firm*—Stevens, Davis, Miller & Mosher

[57] ABSTRACT

A wiring unit of high reliability is obtained without the need for any chemical treatment. It is obtained by assembling a wiring means having a predetermined wiring pattern and made from a conductive plate into an insulating frame having a predetermined pattern and electrically connecting circuit elements to the wiring means.

8 Claims, 25 Drawing Figures

WIRING UNIT

BACKGROUND OF THE INVENTION

1. Field of the Invention

This invention relates to wiring units constituting wiring blocks, in which various circuit elements are connected.

2. Description of the Prior Art

Heretofore, printed circuits which are formed by printing a copper foil in a predetermined wiring pattern on an insulating substrate chiefly composed of resins, have been used as the wiring block. However, the substrate of the printed circuit is subject to warping or bowing with a change in ambient temperature, resulting in breakage of the copper foil and open-circuit conditions. Also, when the substrate is wetted with moisture, its insulating property is likely to deteriorate, so that such undesired results as discharge and burnout are liable to occur. Further a number of chemical treatments are indispensable for etching the copper foil, and this is liable to lead to public environment pollution problems.

SUMMARY OF THE INVENTION

The object of the invention is to make a wiring unit, which has high reliability and overcomes the aforementioned various drawbacks in the prior art.

According to the invention, an excellent wiring unit of high reliability can be readily fabricated, and which comprises a wiring means having a predetermined wiring pattern capable of being very readily formed without ever requiring complicated and advanced chemical etching techniques but through mere press stamping and an insulating frame supporting the wiring means and providing a large space to permit air insulation for elimination of floating capacitance and sufficient ventilation for promoting radiation, the wiring unit being also free from warping and breakage of the wiring means.

DESCRIPTION OF THE PREFERRED EMBODIMENT

An embodiment of the invention will now be described with reference to the accompanying drawing.

Figure 1:
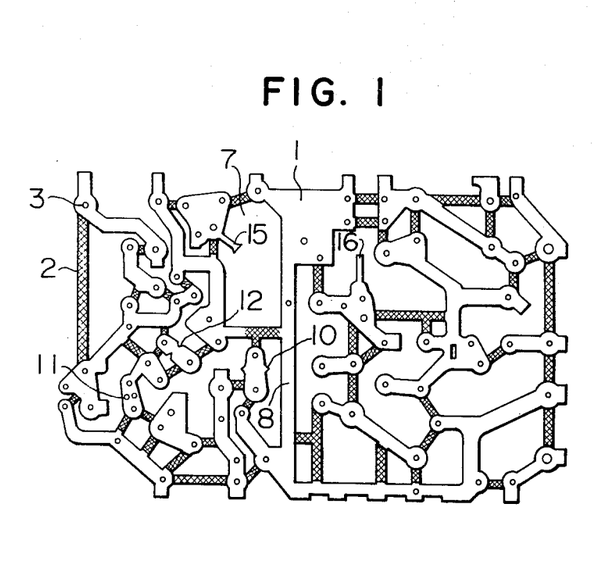
FIG. 1 is a plan view of a wiring pattern plate used in one embodiment of the wiring unit according to the invention.
Figure 2:
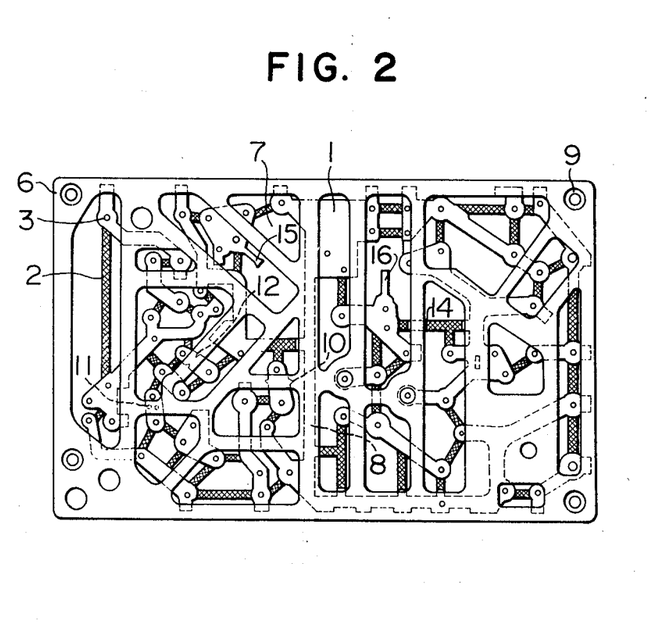
FIG. 2 is a plan view showing the same wiring pattern plate assembled in an insulating frame.

Referring to FIGS. 1 to 4, numeral 1 designates a wiring pattern plate made from a metal plate capable of being soldered such as a copper plate. It is fabricated by press stamping or selectively etching the metal plate such as copper plate after the desired wiring circuit pattern. This wiring pattern plate 1 has a thickness of a fraction of a millimeter or around 1 millimeter, so that it has in itself some rigidity. As shown in FIGS. 1 and 2, the wiring pattern plate 1 includes integral connecting portions 2 (shaded portions) other than the desired wiring portion to be ultimately obtained. These connecting portions 2 are unnecessary in the construction of the eventual electric circuit, but they are integrally provided until the final step because without them it is difficult to produce the intended wiring unit with the rest of the wiring pattern plate 1 separated into individual wiring portions. Numeral 3 designates see-through holes formed in the individual wiring portions for passing and securing leads 5 of circuit elements 4. They are formed at the time of the press stamping. The wiring pattern plate 1 is not limited to a copper plate, but it is also possible to use brass, bronze, aluminum, iron, etc. Also, at the time of press stamping to form the wiring pattern plate 1, it is possible to simultaneously form projections, raised portions or squeezed portions for facilitating the attachment of reinforcing members or circuit parts. Further, some of the afore-mentioned see-through holes 3 for attaching circuit elements may be formed such that some circuit elements may be locked to them, such as a circuit part 4 shown in FIG. 4, and it is also possible to form feed holes at the time of the press stamping.

The wiring pattern plate 1 formed by the press stamping is subjected, if it is found necessary, to a rust-proofing treatment, corrosion-proof treatment or surface treatment for improving the soldering property. Then, distortions that have resulted in the press stamping process are corrected. At this time, if the material of the wiring pattern plate 1 is aluminum, a coating of a soldering property imparting material such as tin or zinc may be formed. Portions where soldering is not necessary may be treated with a solder resist material.

Figure 3:
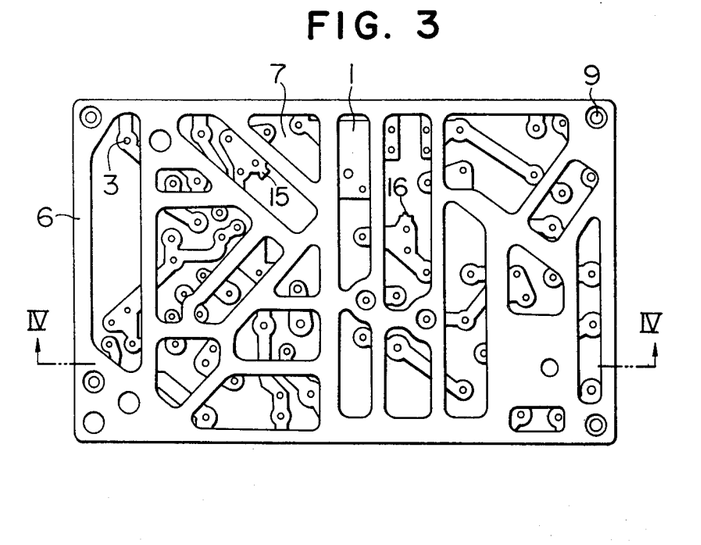
FIG. 3 is a plan view showing the same wiring pattern plate and insulating frame with unnecessary connecting portions removed.
Figure 4:
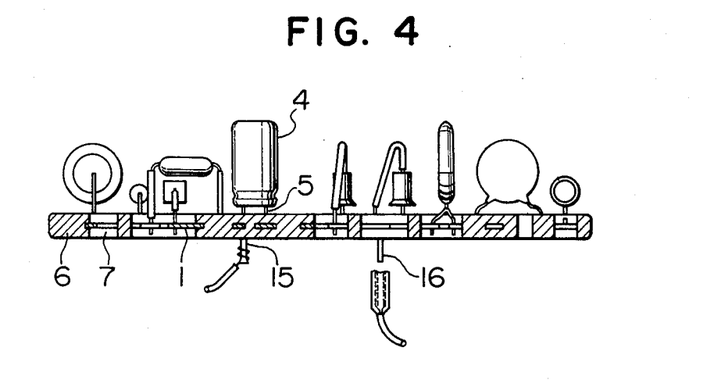
FIG. 4 is a sectional view of the same embodiment of the wiring unit.
Figure 5A:
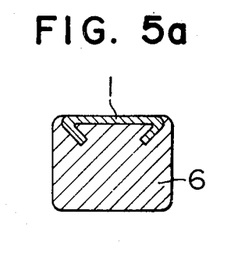
FIGS. 5a and 5b are fragmentary sectional views showing other embodiments of the wiring unit.
Figure 5B:
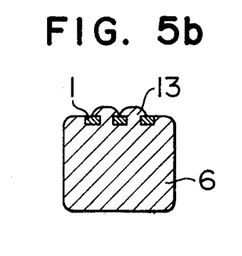
Figure 6:
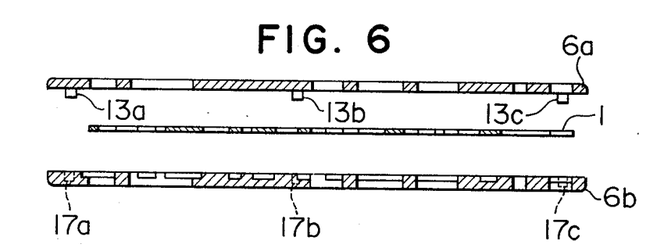
FIG. 6 is an exploded sectional view of a further embodiment of the wiring unit, where the insulating frame consists of two vertical halves.

The resultant wiring pattern plate 1 is then integrally covered on both sides with an insulating frame 6. As shown in FIG. 2, the insulating frame 6 has a punched pattern having a minimum area required for reinforcing the wiring pattern plate 1 and preventing the individual wiring portions thereof getting separated or mutually shifted. This insulating film 6 is made of a thermosetting material free from thermal corrosion such as phenol or epoxy resins or dialurphthalate, and if necessary glass fibers may be incorporated to increase the mechanical strength. The conventional direct pressure type or transfer type moulding machine may be used for forming the insulating frame. The insulating frame 6 has an integral pattern permitting total exposure of the apertures 7 of the wiring pattern plate 1 for mounting circuit elements and also having sufficient physical strength against external forces. It is formed with as large apertures as possible to utilize air insulation for eliminating floating capacitance and also to provide sufficient ventilation so as to permit effective radiation for suppressing the temperature rise of the circuit elements 4. To further improve the physical strength, a long central wiring portion, such as one indicated at 8 in FIG. 2, may be provided in the wiring pattern plate 1, and also metal washers required for securing the unit to a chassis may be integrally embedded at the four corners of the frame. Further, as shown in FIGS. 12, 13a, 13b and 13c it is possible to provide the insulating frame with top support seats 18, 19 and 20 for holding the mounted circuit elements 4 against tilting or dropping. Furthermore, lest the eventual wiring portions should detach from the insulating frame 6, protuberances 10, indented portions 12, raised portions 11 and so forth may be formed at suitable portions of the wiring pattern plate 1 and clamped in the insulating frame 6. The wiring pattern plate 1 may be located near the center of the thickness of the insulating frame 6, as shown in FIG. 4, which is a section taken along line IV—IV in FIG. 3, or it may be secured to one side of the insulating frame. In the case of securing the wiring pattern plate 1 to one side of the insulating frame 6, the wiring pattern plate 1 may be provided with bent edges, and the insulating frame 6 may be formed on the bent edge side of wiring pattern plate 1, as shown in FIG. 5a. Alternatively, the insulating frame 6 may be provided with raised portions 13, and attachment holes (not shown) formed in the wiring pattern plate 1 may be fitted on the raised portions, as shown in FIG. 5b. As a further alternative, the insulating plate 6 may be separately formed by means of moulding, and the wiring pattern plate 1 may be secured to the insulating frame by means of caulking. In case of locating the wiring pattern plate 1 near the center of the thickness of the insulating plate 6, upper and lower insulating frame halves 6a and 6b, as shown in FIG. 6, may be separately formed, and then the wiring pattern plate 1 may be sandwiched between the two insulating frame halves 6a and 6b with projections 13a, 13b and 13c of the upper frame half fitted in respective recesses 17a, 17b and 17c in the lower frame half and then secured to the frame by means of adhesive or corking.

Figure 7:
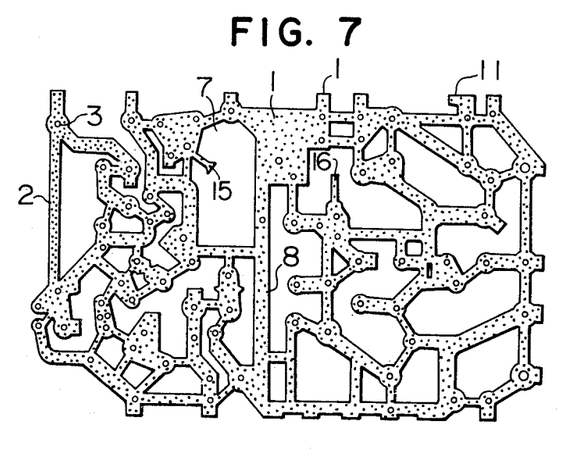
FIG. 7 is a plan view of a wiring pattern plate having many small holes or pores.
Figure 8:
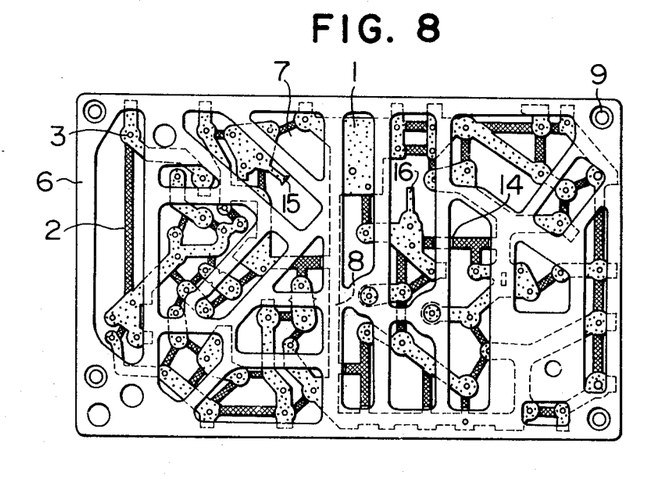
FIG. 8 is a plan view showing the same wiring pattern plate assembled in an insulating frame.
Figure 9:
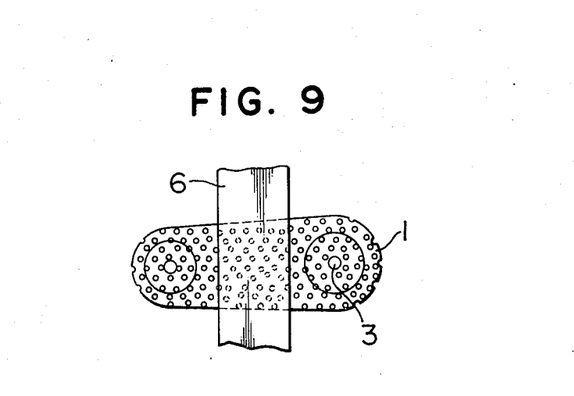
FIG. 9 is a fragmentary plan view of the same unit.
Figure 10:
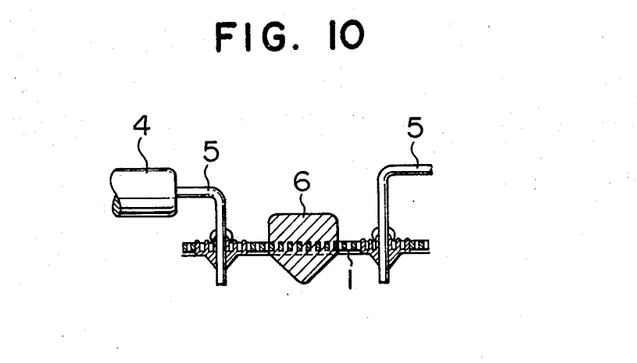
FIG. 10 is a fragmentary sectional view of the same unit.
Figure 11:
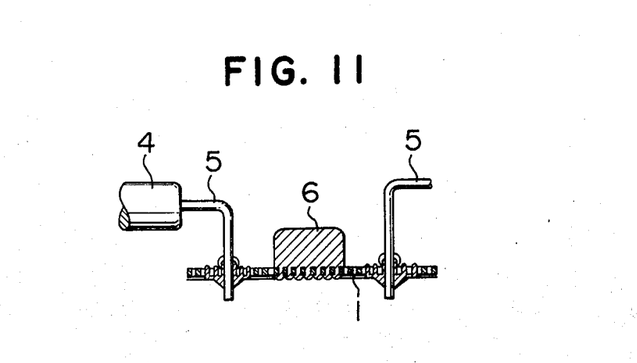
FIG. 11 is a view similar to FIG. 10 but showing a different embodiment.
Figure 12:
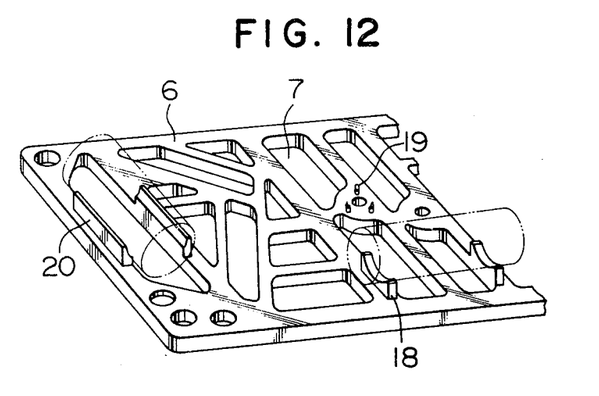
FIG. 12 is a perspective view of an insulating frame provided with support seats.
Figure 13A:
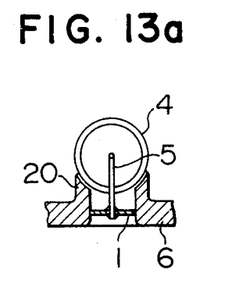
FIGS. 13a, 13b and 13c are fragmentary sectional views showing portions of the same insulating frame.
Figure 13B:
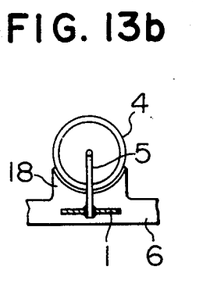
Figure 13C:
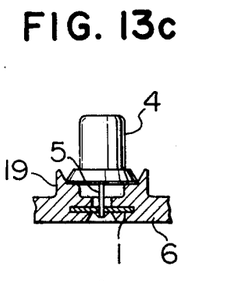

FIGS. 7 and 8 show a modified wiring pattern plate 1, which is made of a perforated or punched metal plate having many small holes or pores. With this wiring pattern plate good securement of the insulating plate 6 to the plate may be obtained, as shown in FIGS. 9, 10 and 11. Also, at the time of soldering the leads 5 of the circuit elements 4, the solder can very securely attach itself, so that good electric connection can be obtained.

In the state shown in FIG. 2, the undesired connecting portions 2 remain, and which must be removed. These connecting portions 2 are cut away by means of a severing press, and the resultant system is shown in FIG. 3. At this time, it is difficult to cut connecting portions 2 partly held within the insulating frame 6 such that the cutting surface is flush with the pertaining surface of the insulating frame 6, as shown at 14 in FIG. 3. However, the remaining portion of the connection portion 2 slightly extending from the insulating frame 6 gives rise to no problem. At the time of cutting with the severing press connection to an external circuit, as shown at 15 and 16 in FIG. 4, are bent to project from the underside of the insulating frame 6, so that plugs for connection to an external circuit may be pressure fitted on the bent portions of the connection terminals.

The surface of the insulating frame 6 may be given a color. This is very useful where there are a number of wiring units of a plurality of different kinds. In such a case, a desired wiring unit of a corresponding color among units of various colors may be readily selected. This is very advantageous in manufacture and repair. Also, one insulating frame may be given several different colors for different areas. By this means, fine and intricated circuit sections can be readily discriminated. Further, it is possible to print marks indicating the positions of the individual circuit elements on the surface of the insulating frame.

Figure 14A:
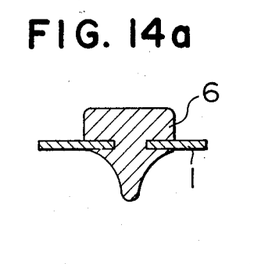
FIGS. 14a, 14b and 15 are fragmentary sectional views showing an insulating frame with individual sections provided on the lower side thereof with chamfers.
Figure 14B:
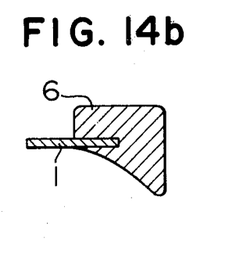
Figure 15:
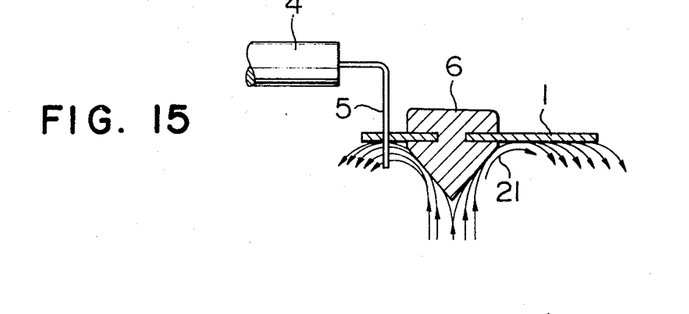

FIGS. 14a and 14b show insulating frames 6 provided with chamfers on the lower side. This structure is advantageous for effecting the soldering automatically by exposing the eventual wiring unit to a jet of atomized solder, as shown in FIG. 15. Here, the jet 21 of atomized solder can be smoothly guided along the chamfered portions of the insulating frame 6, so that the solder can attach to the entire exposed area of the wiring pattern plate 1. Thus, the leads 5 of the circuit elements 4 can be reliably soldered, so that it is possible to eliminate accidents due to contact failure.

Figure 16:
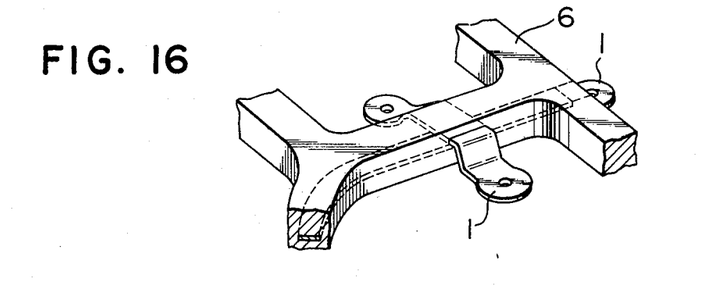
FIG. 16 is a fragmentary perspective view showing a further embodiment having two vertically spaced wiring pattern plates assembled in an insulating frame.
Figure 17:
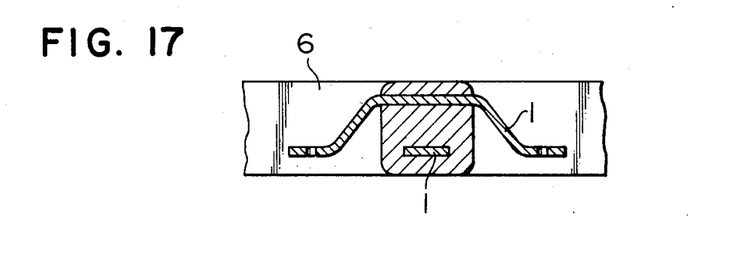
FIGS. 17 and 18 are fragmentary sectional views of the same embodiment.
Figure 18:
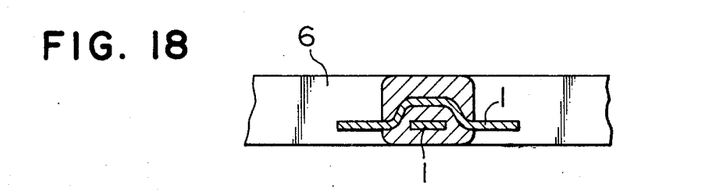

FIGS. 16, 17 and 18 show a structure where two vertically spaced wiring pattern plates 1 electrically insulated from each other are embedded in an insulating frame 6. With this structure three-dimensional wiring not obtainable with the prior art printed circuit techniques can be readily obtained.

Figure 19:
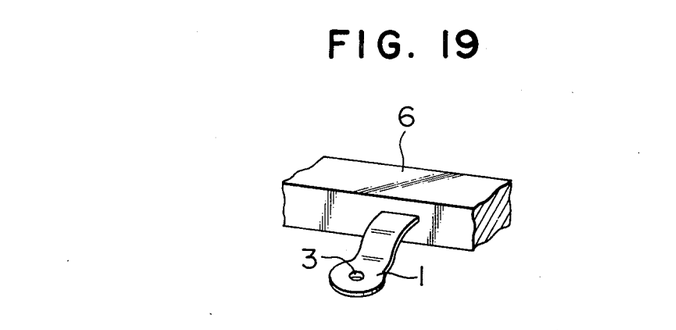
FIG. 19 is a fragmentary perspective view showing a further embodiment where portions of wiring pattern plate are bent and projected from an insulating frame.
Figure 20:
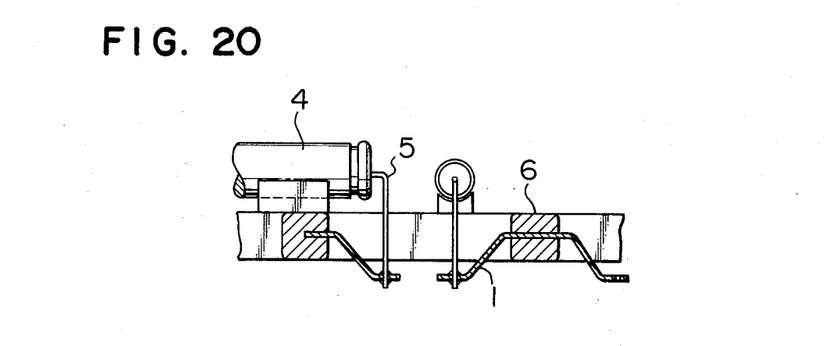
FIG. 20 is a fragmentary sectional view of the same.
Figure 21:
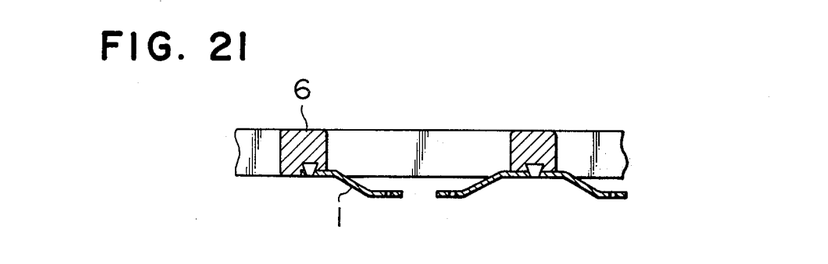
FIG. 21 is a fragmentary sectional view of a further embodiment where portions of wiring pattern plate are bent and projected from an insulating frame.

FIGS. 19, 20 and 21 show structures where portions of the wiring pattern plate 1 having see-through holes 3 for connection to leads of circuit elements are bent to project from the insulating frame 6. This structure permits soldering with the jet of atomized solder such that the solder attaches only to the neighborhood of the see-through holes 3 and not to other unnecessary portions. Thus, the processibility can be extremely improved. In the structure of FIG. 21, a portion of the wiring pattern plate 1 is bent and deeply wedged into the insulating frame to provide firm security.

What is claimed is:

1. A printed circuit wiring unit, comprising: a conductive wiring pattern having a plurality of electrical lead portions connected in a fixed pattern by a plurality of removable connecting portions, said lead portions and said connecting portions being fabricated as a unitary structure from a conductive metal plate, said electrical lead portions having holes formed therein at the end portions thereof for insertion therethrough of circuit element leads, said electrical lead portions being formed from a perforated metal plate and said circuit element lead insertion holes being larger than the perforations in said electrical lead portions; and an insulating frame to which said conductive plate is secured, said insulating frame having a plurality of relatively large openings formed therein from which the hole-containing ends of said electrical lead portions project, said openings in said insulating frame permitting movement of substantial amounts of ventilating air through said wiring unit and providing air insulation between non-electrically connected portions of said wiring pattern to substantially eliminate floating capacitance in said wiring unit when said removable connecting portions have been removed.

2. A printed circuit wiring unit according to claim 1, wherein said insulating frame includes a plurality of support seats on at least one surface thereof for supporting circuit elements on said frame, the electrical leads of said circuit elements being inserted through corresponding holes in the projecting ends of said electrical lead portions of said conductive wiring pattern.

3. A printed circuit wiring unit according to claim 1, further comprising: a second conductive wiring pattern comprising a second plurality of electrical lead portions connected in a fixed pattern by a second plurality of removable connecting portions, said second lead portions and connecting portions being fabricated as a unitary structure from a second conductive metal plate and having a second plurality of holes formed at respective ends of said second electrical lead portions for insertion therethrough of circuit element leads; said second wiring pattern being secured to said insulating frame in spaced relation to said first conductive wiring pattern with the hole-containing ends of said second plurality of electrical lead portions projecting from said openings in said insulating frame to form a multi-layer wiring pattern on said insulating frame.

4. A printed circuit wiring unit according to claim 1, wherein said projecting ends of said electrical lead portions are bent to extend downwardly from said lower surface of and into said openings in said insulating frame.

5. A printed circuit wiring unit, comprising: a conductive wiring pattern having a plurality of electrical lead portions connected in a fixed pattern by a plurality of removable connecting portions, said lead portions and said connecting portions being fabricated as a unitary structure from a conductive metal plate, said electrical lead portions having therethrough formed therein at the end portions thereof for insertion therethough of circuit element leads; and an insulating frame to which said conductive plate is secured, said insulating frame having a plurality of relatively large openings formed therein from which the hole-containing ends of said electrical lead portions project, said insulating frame being chamfered on the lower side to guide an atomized solder jet toward and into contact with said projecting ends of said electrical lead portions, said openings in said insulating frame permitting movement of substantial amounts of ventilating air through said wiring unit and providing air insulation between non-electrically connected portions of said wiring pattern to substantially eliminate floating capacitance in said wiring unit when said removable connecting portions have been removed.

6. A printed circuit wiring unit according to claim 5, wherein said insulating frame includes a plurality of support seats on at least one surface thereof for supporting circuit elements on said frame, the electrical leads of said circuit elements being inserted through corresponding holes in the projecting ends of said electrical lead portions of said conductive wiring pattern.

7. A printed circuit wiring unit according to claim 5, further comprising: a second conductive wiring pattern comprising a second plurality of electrical lead portions connected in a fixed pattern by a second plurality of removable connecting portions, said second lead portions and connecting portions being fabricated as a unitary structure from a second conductive metal plate and having a second plurality of holes formed at respective ends of said second electrical lead portions for insertion therethrough of circuit element leads; said second wiring pattern being secured to said insulating frame in spaced relation to said first conductive wiring pattern with the hole-containing ends of said second plurality of electrical lead portions projecting from said openings in said insulating frame to form a multi-layer wiring pattern on said insulating frame.

8. A printed circuit wiring unit according to claim 5, wherein said projecting ends of said electrical lead portions are bent to extend downwardly from said lower surface of and into said openings in said insulating frame.

* * * * *